(12) United States Patent
Engels

(10) Patent No.: US 8,436,652 B2
(45) Date of Patent: May 7, 2013

(54) DUAL-EDGE REGISTER AND THE MONITORING THEREOF ON THE BASIS OF A CLOCK

(75) Inventor: Sylvain Engels, Meylan (FR)

(73) Assignee: STMicroelectronics, SA, Montrogue (FR)

(*) Notice: Subject to any disclaimer, the term of this patent is extended or adjusted under 35 U.S.C. 154(b) by 0 days.

(21) Appl. No.: 13/152,008

(22) Filed: Jun. 2, 2011

(65) Prior Publication Data

US 2011/0298491 A1 Dec. 8, 2011

(30) Foreign Application Priority Data

Jun. 4, 2010 (FR) ...................... 10 54390

(51) Int. Cl.
*H03K 19/173* (2006.01)

(52) U.S. Cl.
USPC .................. 326/46; 326/40; 326/41; 326/47; 327/201; 327/218

(58) Field of Classification Search ........... 326/16, 326/37–41, 46–47; 327/200–219
See application file for complete search history.

(56) References Cited

U.S. PATENT DOCUMENTS

| | | | |
|---|---|---|---|
| 5,406,216 A | 4/1995 | Millman et al. | |
| 6,300,809 B1 * | 10/2001 | Gregor et al. | 327/200 |
| 7,353,441 B2 * | 4/2008 | Hirano | 714/726 |
| 7,596,732 B2 * | 9/2009 | Branch et al. | 714/726 |
| 2003/0218488 A1 | 11/2003 | Parulkar et al. | |
| 2005/0005214 A1 | 1/2005 | Ueda | |
| 2007/0220382 A1 | 9/2007 | Lackey | |

OTHER PUBLICATIONS

République Française Institut National de la Propriété Industrielle, Rapport de Recherche Préliminaire (Preliminary Search Report); issued in French Patent Application No. 10/54390 on Mar. 10, 2011 (2 pages).

* cited by examiner

*Primary Examiner* — Jany Tran
(74) *Attorney, Agent, or Firm* — Slater & Matsil, L.L.P.

(57) ABSTRACT

Sequential electronic circuit (10) reacting on a rising edge and a falling edge of a clock signal (CK), comprising a first (1) and a second (2) D-type flip-flop, a main multiplexer (3) coupled at input to the flip-flops (1 and 2), the circuit (10) comprising a first input receiving the clock signal (CK) and a second input receiving a control signal (TE) so as to control the circuit (10) according to a normal operating mode and a test operating mode making it possible to check the proper operation of the sequential electronic circuit (10). The clock signal (CK) used in the normal operating mode is used to gate the circuit (10) during the test operating mode.

23 Claims, 2 Drawing Sheets

DUAL-EDGE REGISTER AND THE MONITORING THEREOF ON THE BASIS OF A CLOCK

This application claims the benefit of French patent application Ser. No. 10/54390, filed on Jun. 4, 2010, entitled "Dual-Edge Register and the Monitoring thereof on the Basis of a Clock," which application is hereby incorporated herein by reference to the maximum extent allowable by law.

TECHNICAL FIELD

The invention relates to monitoring the operation of a dual-clock edge register, and more particularly, monitoring dual-edge sequential electronic clock circuit on the basis of the clock used during normal operation.

BACKGROUND

Dual-clock edge sequential electronic circuits, or dual-clock edge registers such as the register A illustrated in FIG. 1, generally comprise a first D-type flip-flop 1, a second D-type flip-flop 2 and a multiplexer 3 sometimes referred to herein as a main multiplexer. The output of each of the two flip-flops 1 and 2 is coupled to a respective input of the main multiplexer.

A data signal D is delivered to a first input of the first flip-flop 1 and to a first input of the second flip-flop 2. The register A is gated by a clock signal CK. The clock signal CK is thus coupled to the clock signal input of each of the two flip-flops 1 and 2, as well as to the selection input of the main multiplexer 3. The selection input of a multiplexer corresponds to the input receiving the control signal which determines that signal, from among the two input signals, which is to be copied over to output.

The clock input of the second flip-flop 2 is an inverting input so that the second flip-flop 2 reacts on a clock falling edge while the first flip-flop, which does not possess an inverting clock input, reacts on a rising edge of the clock. Thus the register A operates in dual-clock edge fashion, that is to say it reacts both on a clock rising edge and on a clock falling edge.

Indeed, the first flip-flop 1 copies over, at its output, the value of the input signal, that is to say the data signal D, on a rising edge, while the second flip-flop 2 copies over at its output the value of the input signal, that is to say the data signal D, on a falling edge. The main multiplexer 3, as in a conventional dual-edge register, then receives at its inputs the output signals of the two flip-flops 1 and 2. The main multiplexer 3, also being gated by the clock signal CK, delivers at output Q the output signal of the first flip-flop 1 on a rising edge of the clock signal CK, and the output signal of the second flip-flop 2 on a falling edge. Indeed, on a rising edge of the clock signal, that is to say for a non-zero value of the clock signal, the output copies over the signal received at the first input, while on a clock falling edge, that is to say for a zero value of the clock signal, the output copies over the signal received on the second input of the main multiplexer 3.

Such dual-clock edge registers thus make it possible to double the passband with respect to a single-edge register, for one and the same clock frequency, thus making it possible to reduce the overall energy consumption. Note particularly, the consumption of a clock typically represents 30% of the energy consumption of an integrated circuit.

These sequential electronic circuits are difficult to test. Indeed, systems making it possible to test the proper operation of such circuits remain complex. The document US 2003/0218488 describes one method and system for checking the operation of a dual-clock edge register. However, in this document, to allow such a check, the system uses a second clock distinct from the clock used during normal operation. The use of two clocks then increases the energy consumption of the system.

SUMMARY OF THE INVENTION

According to one embodiment and one mode of implementation, there is proposed an architecture of a dual-clock edge register making it possible to check the operation of the register on the basis of the clock used during normal operation and thus to reduce the energy consumption of the system.

According to one aspect, there is proposed, in one embodiment, a sequential electronic circuit reacting on a rising edge and a falling edge of a clock signal, comprising a first and a second D-type flip-flop, a main multiplexer coupled at input to the flip-flops, the circuit comprising a first input receiving the clock signal and a second input receiving a control signal so as to control the circuit according to a normal operating mode and a test operating mode making it possible to check the proper operation of the sequential electronic circuit. According to a general characteristic, the clock signal used in the normal operating mode is used to gate the circuit during the test operating mode.

According to another aspect, there is proposed in one mode of implementation, a method for checking operation of a sequential electronic circuit reacting on a rising edge and a falling edge of a clock signal, comprising a first and a second D-type flip-flop, a main multiplexer coupled at input to the flip-flops, the circuit comprising a first input receiving the clock signal and a second input receiving a control signal so as to control the circuit according to a normal operating mode and a test operating mode making it possible to check the proper operation of the sequential electronic circuit.

BRIEF DESCRIPTION OF THE DRAWINGS

Other advantages and characteristics of the invention will be apparent on examining the detailed description of wholly non-limiting embodiments and the appended drawings in which.

DETAILED DESCRIPTION OF ILLUSTRATIVE EMBODIMENTS

Figure 1:
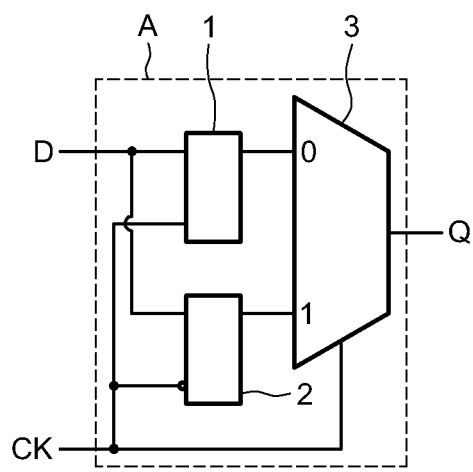
FIG. 1, already cited, represents a sequential electronic circuit according to the prior art.

Before addressing the illustrated embodiments in detail, several embodiments and advantageous features are discussed generally in the following paragraphs.

According to one aspect, there is proposed, in one embodiment, a sequential electronic circuit reacting on a rising edge and a falling edge of a clock signal, comprising a first and a second D-type flip-flop, a main multiplexer coupled at input to the flip-flops, the circuit comprising a first input receiving the clock signal and a second input receiving a control signal so as to control the circuit according to a normal operating mode and a test operating mode making it possible to check the proper operation of the sequential electronic circuit. According to a general characteristic, the clock signal used in the normal operating mode is used to gate the circuit during the test operating mode. Thus, the sequential electronic circuit operates on the basis of a single clock whatever the mode, and thus makes it possible to maintain reduced energy consumption.

Preferably, the sequential electronic circuit comprises a first multiplexer coupled to the data input of the first flip-flop, a second multiplexer coupled to the data input of the second flip-flop, the first and the second multiplexers receiving at their respective first inputs, one and the same data signal, the first multiplexer also being coupled at its input to the output of the second flip-flop, the second multiplexer also being coupled at input to a test signal, and the respective outputs of the first and of the second flip-flops being coupled to the respective inputs of the main multiplexer.

Advantageously, the control signal is delivered at the respective inputs of the first and the second multiplexers so as to control the operation of the two multiplexers according to a normal operating mode and a test operating mode.

According to one embodiment, the sequential electronic circuit can comprise means for placing sequential electronic circuits in series so as to carry out a check of the operation of several sequential electronic circuits on the basis of the said test signal. The means for placing in series preferably comprise an "AND" logic gate receiving at its input the control signal and the output signal of the first flip-flop, the output of the "AND" logic gate being connected to the input of the test signal of another sequential electronic circuit.

According to another aspect, there is proposed in one mode of implementation, a method for checking operation of a sequential electronic circuit reacting on a rising edge and a falling edge of a clock signal, comprising a first and a second D-type flip-flop, a main multiplexer coupled at its input to the flip-flops, the circuit comprising a first input receiving the clock signal and a second input receiving a control signal so as to control the circuit according to a normal operating mode and a test operating mode making it possible to check the proper operation of the sequential electronic circuit.

According to a general characteristic, the clock signal used in the normal operating mode is used to gate the circuit during the test operating mode. The control signal can advantageously control the operation of the two multiplexers according to a normal operating mode and a test operating mode.

Preferably, the method comprises, in the test operating mode, receiving a test signal at the input of the second multiplexer, receiving the output signal of the second flip-flop at the input of the first multiplexer, the output signal of the second flip-flop corresponding to the test signal, and generating an output signal on the basis of the output signals of the second flip-flop and of the first flip-flop.

Advantageously, the method can comprise generating an additional output signal on the basis of the control signal and of the output signal of the first flip-flop, the additional output signal being coupled to the test signal input of another sequential electronic circuit.

Figure 2:
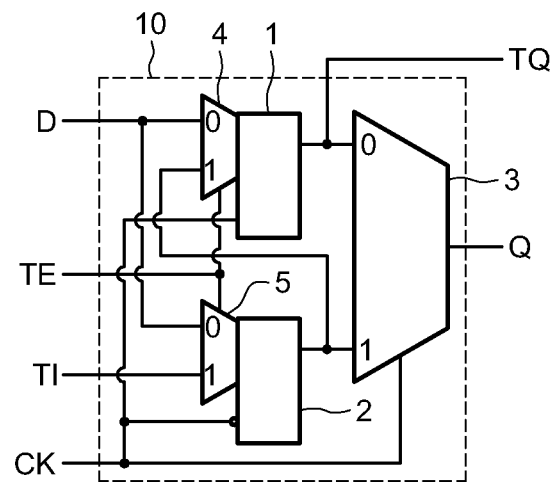
FIG. 2 represents a sequential electronic circuit according to a first embodiment.

FIG. 2 illustrates a dual-clock edge sequential electronic circuit 10 according to a first embodiment. The sequential electronic circuit 10, corresponding to a register, comprises a first D-type flip-flop 1, a second flip-flop 2 of type 2, and a main multiplexer 3 coupled at its respective input to the flip-flops 1 and 2. The output of each of the two flip-flops 1 and 2 is coupled to a corresponding input of the main multiplexer.

The register 10 also comprises a first multiplexer 4 coupled to the single data input of the first flip-flop 1, and a second multiplexer 5 coupled to the single data input of the second flip-flop 2.

A data signal D is delivered to an input of the register 10. This input of the register 10 is coupled to a first input of the first multiplexer 4 and to a first input of the second multiplexer 5. The second multiplexer 5 is coupled at a second input to a test signal TI making it possible to impose a test value on the register 10 while the register 10 is operating in the test operating mode. The first multiplexer 4 is coupled on a second input to the output of the second flip-flop 2.

The respective selection inputs of the first and of the second multiplexers 4 and 5 are coupled to a control signal TE. The selection input of a multiplexer corresponds to the input receiving the control signal which determines that signal, from among the two input signals, which is to be copied over at output.

A clock signal CK is delivered to another input of the register 10. This other input of the register 10 is coupled to the clock signal input of each of the two flip-flops 1 and 2, as well as to the selection input of the main multiplexer 3. The clock input of the second flip-flop 2 is an inverting input so that the second flip-flop 2 will react on a clock falling edge while the first flip-flop not possessing an inverting clock input will react on a rising edge. Thus the register 10 operates in dual-clock edge fashion, that is to say it reacts both on a clock rising edge and on a clock falling edge.

Thus, when the control signal TE is zero, the register 10 operates in normal mode, as a dual-clock edge register. The first and second multiplexers receiving a zero control signal deliver at their respective outputs, the signal received at their respective first inputs, that is to say the data signal D, doing so without any lag. On the other hand, the flip-flops 1 and 2 being gated by the clock signal CK, the first flip-flop 1 copies over at output the value of the input signal, that is to say the data signal D, on a rising edge, while the second flip-flop 2 will copy over at output the value of the input signal, that is to say the data signal D, on a falling edge.

The main multiplexer 3, as in a conventional dual-edge register, then receives at its input the output signals of the two flip-flops 1 and 2. The main multiplexer 3, being gated by the clock signal CK, delivers at its output the output signal of the first flip-flop 1 on a rising edge of the clock signal CK, and the output signal of the second flip-flop 2 on a falling edge. Indeed, on a rising edge of the clock signal, that is to say for a non-zero value of the clock signal, the output copies over the signal received at the first input of the main multiplexer 3, while on a clock falling edge, that is to say for a zero value of the clock signal, the output copies over the signal received on the second input of the main multiplexer 3.

On the other hand, when the control signal TE is non-zero, the register 10 operates in a test mode. The first and second multiplexer, receiving a non-zero control signal, then deliver at their respective outputs the signal received at their respective second inputs, that is to say the test signal TI, doing so without any lag. The flip-flops 1 and 2 are gated by the clock signal CK. Initially, the second flip-flop 2 copies over, at its output, the value of the input signal, that is to say the test signal TI, on a falling edge. This output signal of the second flip-flop is then delivered directly at input TI (the second input) to the first flip-flop 1. Subsequently, on the following rising edge, the first flip-flop 1 copies over at its output the value of the input signal, that is to say the output signal of the second flip-flop 2, the value of which is the value of the signal TI. This output signal of the second flip-flop is then delivered directly at output TQ. Thus, if the register 10 operates correctly, the signal TI should be delivered at the output on the rising edges. Thus, by monitoring the output of the register 10, in the test operating mode, it is possible to monitor the proper operation of the register.

Figure 3:
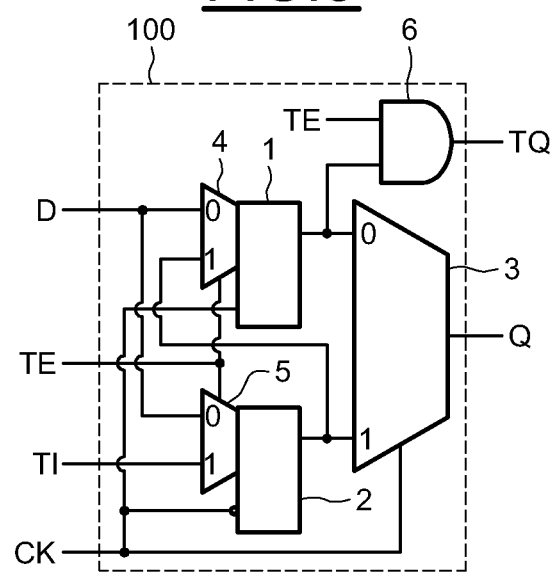
FIG. 3 represents a sequential electronic circuit according to a second embodiment.

FIG. 3 represents a dual-clock edge sequential electronic circuit 100 according to a second embodiment. The elements which are identical to the sequential electronic circuit 10 represented in FIG. 2 bear the same reference numerals.

In this second embodiment, the register 100 comprises, in addition to the elements described previously, means 6 for placing registers in series so as to carry out a check of the operation of several registers on the basis of one and the same test signal TI.

Here, the means 6 for placing in series comprises an "AND" logic gate receiving at its input the control signal TE and the output signal of the first flip-flop 1, and delivering at its output an output signal TQ.

In the normal operating mode, the control signal TE is zero. Consequently, the output signal TQ of the AND gate is always zero. On the other hand, in the test mode, the control signal TE is non-zero. The value of the output signal TQ of the "AND" gate is then that of the output signal of the first flip-flop 1. This signal corresponds, after the first succession of a clock falling edge and of a clock rising edge, to the test signal TI. Thus, a second dual-edge register, whose input intended for the test signal TI is coupled to the output TQ of the means for placing in series, may be tested with the same test signal TI as the first dual-clock edge register.

What is claimed is:

1. A sequential electronic circuit reacting on a rising edge and a falling edge of a clock signal, comprising:
    a first and a second D-type flip-flop, the second flip-flop having an inverting clock input;
    a main multiplexer coupled at a first input to the first flip-flop and at a second input to the second flip-flop;
    a first input receiving the clock signal; and
    a second input receiving a control signal so as to control the circuit according to a normal operating mode and a test operating mode making it possible to check the proper operation of the sequential electronic circuit;
    wherein the clock signal used in the normal operating mode is used to gate the circuit during the test operating mode; and
    wherein an input of the first flip-flop is coupled to the output of the second flip flop during the test operating mode.

2. The sequential electronic circuit according to claim 1, further comprising:
    a first multiplexer coupled to a data input of the first flip-flop;
    a second multiplexer coupled to a data input of the second flip-flop;
    wherein the first and the second multiplexers are coupled at the respective data inputs to one and the same data signal, the first multiplexer also being coupled at a second input to the output of the second flip-flop, the second multiplexer also being coupled at a second input to a test signal; and
    wherein the respective outputs of the first and the second flip-flops are coupled to respective inputs of the main multiplexer.

3. The sequential electronic circuit according to claim 1, characterized in that the control signal is delivered at respective control inputs of the first and the second multiplexers so as to control the operation of the two multiplexers according to a normal operating mode and a test operating mode.

4. The sequential electronic circuit according to claim 2, further comprising:
    means for placing the sequential electronic circuit in series with a second sequential electronic circuit so as to carry out a check of the operation of a plurality of sequential electronic circuits on the basis of said test signal.

5. The sequential electronic circuit according to claim 4, wherein:
    the means for placing in series comprises an "AND" logic gate receiving at its inputs the control signal and the output signal of the first flip-flop, the output of the "AND" logic gate being connected to a test signal input of another sequential electronic circuit.

6. A method for checking operation of a sequential electronic circuit reacting on a rising edge and a falling edge of a clock signal, comprising a first and a second D-type flip-flop, the second flip flop having an inverted clock input, a main multiplexer having respective inputs coupled to the respective outputs of the first and second flip-flops, the circuit comprising a first input receiving the clock signal and a second input receiving a control signal so as to control the circuit according to a normal operating mode and a test operating mode making it possible to check the proper operation of the sequential electronic circuit, the method comprising:
    gating the circuit during the test operating mode with the clock signal used in the normal operating mode; and
    coupling the output of the second flip-flop to the input of the first flip flop during the test operating mode.

7. The method according to claim 6, wherein the control signal controls the operation of the two multiplexers according to a normal operating mode and a test operating mode.

8. The method according to claim 7, further comprising, in the test operating mode, receiving the output signal of the second flip-flop at the input of a first multiplexer, receiving a test signal at a first input of a second multiplexer, the output signal of the second flip-flop corresponding to the test signal, and generating an output signal on the basis of the output signals of the second flip-flop and of the first flip-flop.

9. A method according to claim 8, further comprising generating an additional output signal on the basis of the control signal and of the output signal of the first flip-flop, the additional output signal being coupled to a test signal input of another sequential electronic circuit.

10. A method of operating a circuit comprising:
    in response to a control signal, selecting one of a data signal and a test signal at the input of a first flip-flop; and
    in response to the control signal, selecting one of the data signal and the test signal at the input of a second flip-flop having an inverted clock input;
    when the control signal is in a first state, passing the data signal from an output of the first flip-flop to a first input of a main multiplexer on a rising edge of a clock signal, and passing the data signal from an output of the second flip-flop to a second input of the main multiplexer on a falling edge of a clock signal; and
    when the control signal is in a second state, passing the test signal from the output of the second flip-flop to the second input of the main multiplexer and to the input of the first flip-flop and passing the test signal from the output of the first flip-flop to the first input of the main multiplexer.

11. The method of claim 10 further comprising:
    passing the data signal to an output of the circuit on both a rising edge and a falling edge of the clock signal when the control signal is in the first state; and
    passing the test signal to a test output of the circuit on a rising edge of the clock signal when the control signal is in the second state.

12. The method of claim 11 further comprising logically combining the test signal and the control signal before passing the test signal to the test output and passing the combined signal to a second circuit.

13. The method of claim 10 further comprising feeding the clock signal to the main multiplexer as a selection signal.

14. The method of claim 10 wherein the step of selecting one of a data signal and a test signal at the input of a first flip-flop comprises:
   receiving the data signal and the test signal at respective inputs of a first multiplexer and passing one of the data signal and the test signal to the output of the first multiplexer in response to the control signal acting as a selection signal for the first multiplexer; and
   receiving the data signal and the test signal at respective inputs of a second multiplexer and passing one of the data signal and the test signal to the output of the second multiplexer in response to the control signal acting as a selection signal for the second multiplexer.

15. A method of operating a sequential electronic circuit comprising:
   receiving a clock signal at a clock input;
   receiving a data signal at a data input;
   receiving a control signal at a control signal input;
   receiving a test signal at a test signal input;
   when the control signal is in a first state, passing the data signal to an output on a rising edge of the clock signal and passing the data signal to the output on a falling edge of the clock signal;
   when the control signal is in a second state, latching the data signal in a second latch and passing the test signal to the output and to an input of a first latch on a falling edge of the clock signal, the second latch having an inverted clock signal input; and
   when the control signal is in the second state, latching the data signal in a first latch on a rising edge of the clock signal; and passing the test signal to a test output on a rising edge of the clock signal.

16. The method of claim 15 further comprising passing the test signal to the output on a rising edge of the clock signal.

17. The method of claim 15 further comprising, when the control signal is in the second state, passing the test signal to a second sequential electronic circuit.

18. The method of claim 17 further comprising ANDing the control signal with the test signal prior to passing the test signal to a second sequential electronic circuit.

19. The method of claim 15 wherein:
   the step of passing the data signal to an output on a rising edge of the clock signal comprises passing the data signal to a first input of a first multiplexer, selecting the first input of the first multiplexer based upon the state of the control signal;
   the step of passing the data signal to an output on a falling edge of the clock signal comprises passing the data signal of a first input of a second multiplexer, selecting the first input of the second multiplexer based upon the state of the control signal;
   the step of passing the test signal to the output on a falling edge of the clock signal comprises passing the test signal to a second input of the second multiplexer and selecting the second input based upon the state of the control signal; and
   the step of passing the test signal to a test output on a rising edge of the clock signal comprises passing the test signal to a second input of the first multiplexer and selecting the second input of the first multiplexer based upon the state of the control signal.

20. The method of claim 19 wherein the step of passing the test signal to a second input of the first multiplexer comprises passing the test signal to the output of the second multiplexer and from the output of the second multiplexer to the second input of the first multiplexer.

21. The method of claim 19 wherein:
   the step of passing the data signal to an output on a rising edge of the clock signal and passing the data signal to the output on a falling edge of the clock signal comprises
      passing the output of the first multiplexer to a first input of a main multiplexer,
      passing the output of the second multiplexer to a second input of the main multiplexer; and
      selectively connecting the first input and the second input of the main multiplexer to an output of the main multiplexer in response to the clock signal.

22. The method of claim 15 wherein the first state of the control signal is a low state and wherein the second state of the control signal is a high voltage state.

23. The method of claim 15 further comprising receiving the test signal from a prior sequential electronic circuit and sending the test signal to a subsequent sequential electronic circuit.

* * * * *

UNITED STATES PATENT AND TRADEMARK OFFICE
CERTIFICATE OF CORRECTION

PATENT NO. : 8,436,652 B2
APPLICATION NO. : 13/152008
DATED : May 7, 2013
INVENTOR(S) : Sylvain Engels Page 1 of 1

It is certified that error appears in the above-identified patent and that said Letters Patent is hereby corrected as shown below:

On the Title Page, item (73) Assignee, lines 1-2, delete "STMicroelectronics, SA, Montrogue," and insert -- STMicroelectronics, SA, Montrouge --.

Signed and Sealed this
Fifteenth Day of March, 2016

Michelle K. Lee
*Director of the United States Patent and Trademark Office*